(12) United States Patent
Artieri

(10) Patent No.: US 7,673,095 B2
(45) Date of Patent: Mar. 2, 2010

(54) FIFO MEMORY ARCHITECTURE AND METHOD FOR THE MANAGEMENT OF THE SAME

(75) Inventor: Alain Artieri, Saint Martin d'Heres (FR)

(73) Assignee: STMicroelectronics, SA, Montrouge (FR)

( * ) Notice: Subject to any disclaimer, the term of this patent is extended or adjusted under 35 U.S.C. 154(b) by 488 days.

(21) Appl. No.: 11/016,325

(22) Filed: Dec. 17, 2004

(65) Prior Publication Data

US 2005/0160245 A1 Jul. 21, 2005

(30) Foreign Application Priority Data

Dec. 19, 2003 (FR) .................................. 03 14960

(51) Int. Cl.
*G06F 13/00* (2006.01)
(52) U.S. Cl. ..................... 711/109; 710/52; 365/233.13
(58) Field of Classification Search ................. 711/154, 711/156, 167, 109; 362/130; 710/52; 365/233.13
See application file for complete search history.

(56) References Cited

U.S. PATENT DOCUMENTS

| | | | |
|---|---|---|---|
| 4,258,418 A * | 3/1981 | Heath ........................... | 710/53 |
| 4,779,234 A | 10/1988 | Kaneko et al. | |
| 5,371,877 A | 12/1994 | Drako et al. | |
| 5,613,077 A * | 3/1997 | Leung et al. ................. | 710/305 |
| 6,067,267 A | 5/2000 | Lo | |
| 6,144,608 A | 11/2000 | Artieri | |
| 6,400,642 B1 * | 6/2002 | Mehrotra et al. ........ | 365/233.19 |
| 6,701,390 B2 * | 3/2004 | Ehmann ....................... | 710/33 |
| 2002/0188767 A1 * | 12/2002 | Ehmann ........................ | 710/1 |
| 2003/0067828 A1 * | 4/2003 | Janzen ....................... | 365/222 |
| 2004/0205305 A1 * | 10/2004 | Lee et al. ..................... | 711/149 |

FOREIGN PATENT DOCUMENTS

EP 0 483 441 A 5/1992

OTHER PUBLICATIONS

Masashi Hashimoto et al, 'A 20 NS 256Kx4 FIFI Memory' iEEE Journal of Solid State Circuits, vol. 23 No. 2, Apr. 1988, pp. 490-499.*
French Search Report for 03/14960 dated Aug. 11, 2004.

* cited by examiner

*Primary Examiner*—Christian P Chace
*Assistant Examiner*—Jared I Rutz
(74) *Attorney, Agent, or Firm*—Kevin D. Jablonski; Graybeal Jackson LLP

(57) ABSTRACT

A FIFO memory with a frequency f and a size of M n-bit words, to successively store n-bit words received serially at an input and give said words serially at an output in the order in which they are stored, comprises a basic memory with a frequency f/2, capable of simultaneously storing two n-bit words successively received at the input of the FIFO memory. The memory also comprises a storage circuit to store either one n-bit word received at the input of the FIFO memory or simultaneously two n-bit words produced by the basic memory and to produce, at the output OUT of the FIFO memory, one of the words that said storage circuit stores.

9 Claims, 2 Drawing Sheets

US 7,673,095 B2

FIFO MEMORY ARCHITECTURE AND METHOD FOR THE MANAGEMENT OF THE SAME

CLAIM FOR PRIORITY

This application claims priority from French Patent Application No. 03 14960, which was filed Dec. 19, 2003.

BACKGROUND OF THE INVENTION

1. Field of the Invention

The invention relates to a "first in first out" memory more commonly known as a FIFO memory.

In general, a FIFO memory includes a basic memory (for example of the RAM type) having the size of the FIFO memory and including its read/write circuits, and logic circuits to manage the contents of the FIFO, so that the words are read in the same order as they are stored (this is the principle of the FIFO memory). Prior art FIFO memories are generally small-sized (with 8 to 16 eight-bit words).

2. Description of the Prior Art

The FIFO memories most used at present are built out of a dual-port basic memory comprising a read port and a write port at input and output. An example of such a memory is described in the U.S. Pat. No. 6,144,608. The main drawback of these memories is their size. The presence of the two ports doubles the silicon surface area needed to make a FIFO relative to the silicon surface area needed to make a classic memory of the same capacity (with the same number of words). Furthermore, the memory cells are in practice bigger and the logic circuits necessary to manage the contents of the FIFO memory and the presence of the two ports of the basic memory are more complex and therefore also bigger than those of a classic memory having the same size. Another drawback of these FIFO memories is their clock frequency (equal to the bit rate of words at input or output of the FIFO), which is limited in practice by the clock frequency of the basic dual-port memory used to make them.

Other prior art FIFO memories are made out of single-port basic memories but are used at a frequency twice that of the FIFO memory. The operations of reading in the FIFO are thus made during the even-parity cycles of a clock signal setting the clock frequency (i.e. the working rhythm or rate) of the FIFO memory, while operations of writing to the FIFO memory are made during the odd-parity cycles of the clock signal. The main drawback of these FIFO memories is that a particularly fast basic memory (with a high frequency) needs to be used in order to obtain a FIFO having a reasonable speed, since the frequency of the FIFO is halved relative to the frequency of the basic memory. Now, fast memories are generally costly because they are difficult to make and also consume a great deal of energy.

SUMMARY OF THE INVENTION

An embodiment of the invention is a novel FIFO memory structure that does not have the drawbacks of prior art FIFO memories.

Such an FIFO memory has a frequency f and a size of M n-bit words, to successively store n-bit words received serially at an input and give said words serially at an output in the order in which they are stored. The FIFO memory includes a basic memory with a frequency f/2, capable of simultaneously storing two n-bit words successively received at the input of the FIFO memory. The FIFO memory also has a storage circuit to store either one n-bit word received at the input of the FIFO memory or simultaneously two n-bit words produced by the basic memory and to produce, at the output of the FIFO memory, one of the words that said storage circuit stores.

As will be seen immediately, a FIFO memory with a frequency f according to an embodiment of the invention uses a basic memory with a frequency f/2, that is easier to make and less costly than a memory of the same size but with a frequency f. Furthermore, the basic memory uses a single-port memory as will be seen more clearly in examples, thus further reducing its size.

An embodiment of the invention also relates to a method for the management of the contents of a memory according to an embodiment of the invention during which, to store an n-bit word in the FIFO memory:

an n-bit word is stored in a storage circuit of the FIFO memory if said storage circuit is not full, simultaneously, two n-bit words are stored in the basic memory of the FIFO memory if the storage circuit is full, or two n-bit words previously stored in the basic memory are simultaneously stored in the storage circuit, if two words can be stored in the register.

To output one n-bit word from the FIFO memory:

a word of the storage circuit is read if the storage circuit contains at least one word, the output word being chosen as a function of the order in which the words have been stored in the storage circuit, or if not, a word present at the input of the FIFO memory is read.

BRIEF DESCRIPTION OF THE FIGURES

The invention will be understood more clearly and features and advantages shall appear from the following description of examples of implementation of a FIFO memory according to an embodiment of the invention, represented in the appended FIGS. 1 and 2. It is noted that, for the sake of the clarity of the figures, the same name is used to refer, on the one hand, to an input or output of the memory or a component of the memory and, on the other hand, to the associated signal produced or received by the memory of the component. It is further noted that M, n and p represent integers.

I. FIRST EMBODIMENT OF THE INVENTION

Figure 1:
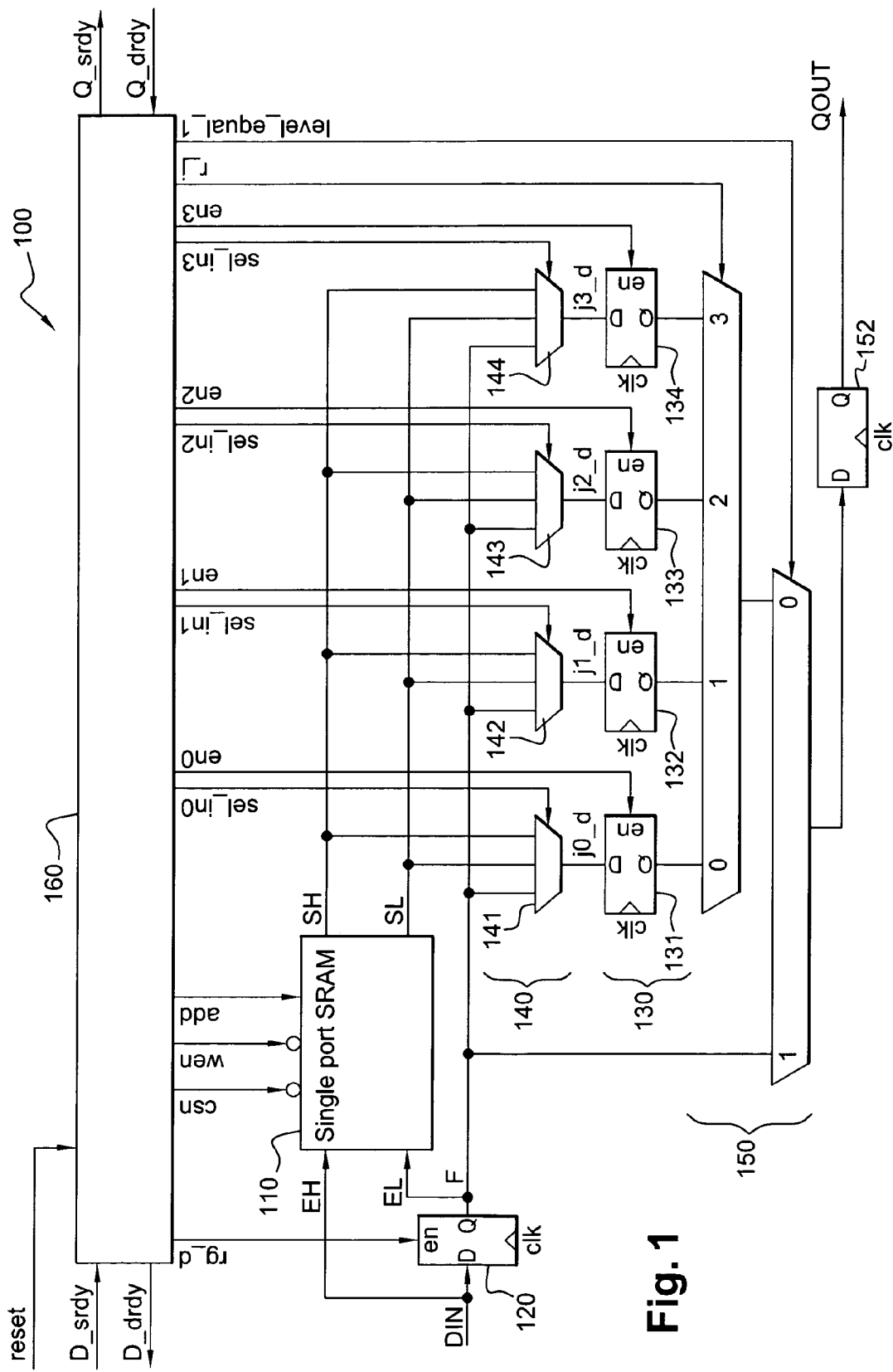

A first exemplary embodiment of a FIFO memory 100 is shown in FIG. 1. The memory has a size M*n (M n-bit words) and a frequency f. The memory 100 has an n-bit data input DIN and an n-bit data output QOUT. The memory also has two information outputs D_DRDY, Q_SRDY, two control inputs D_SRDY, Q_DRDY and one reset input RESET.

The signal D_SRDY informs the memory that a data is present at the input DIN to be stored. The signal Q_DRDY informs the memory that the data must be presented (read) at the output Q. The signal D_DRDY indicates that the memory is not full (and therefore that a data may be input) and the signal Q_SRDY indicates that the memory is not empty (and therefore that a data may be read at the output Q). The signal RESET is used to reset the memory, namely to erase its contents, activate the signal D_DRDY (memory not full) and deactivate the signal Q_SRDY (memory empty).

The general working of the memory 100 is as follows. When the signals D_SRDY and D_DRDY are active (in other words, when an n-bit data is present at the input DIN and the memory is not full), then the piece of data is stored in the FIFO. When the signals Q_DRDY and Q_SRDY are active (in other words, when an n-bit data is expected at the output QOUT and the memory is not empty), then the piece of data is presented at the output Q. The data are read at the output QOUT in the same order as they are input into the input DIN (this is the principle of a FIFO memory).

The memory 100 has a RAM 110, an n-bit register 120, a storage circuit 130 comprising four n-bit registers 131, 132, 133, 134, one selection circuit 140 comprising four multiplexers 141, 142, 143 and 144, one multiplexer 150 and one logic circuit 160. The memory 100 has its frequency set by a clock signal CLK with a frequency f, which sets the frequency especially of the register 120 and the circuit 130.

The basic memory 110 is a RAM memory, for example of the SRAM-type, with only one 2*n-bit parallel port, comprising one data input and one data output of 2*n bits. The memory 110 receives an enabling signal (CSN), a control signal WEN indicating whether a write operation (WEN active) or a read operation (WEN inactive) must be performed when the signal CSN is active and a signal ADD indicating the address to which two data words must be written or read as the case may be. The memory 110 has a capacity of (M−3)/2 words of 2*n-bit and a frequency equal to f/2, i.e., it can store or provide a 2*n-bit word (or two n-bit words in parallel) every two cycles of the signal CLK.

The register 120 is an n-bit register, comprising a parallel input D of n-bit data elements connected to the input DIN of the FIFO memory 100 and also connected to the n most significant bits EH of the input of the memory 110, a parallel n-bit output Q connected to the n least significant bits EL of the input of the memory 110. When the register 120 receives an enabling signal RG_D and a leading edge of the clock signal CLK, it copies the data present at its input D at its output Q. The registers 131, 132, 133, 134 are identical to the register 120. When the register 131, 132, 133, 134 receives a leading edge of the clock signal CLK and an enabling signal EN0, EN1, EN2, EN3 respectively, the register 131, 132, 133, 134 respectively copies the data present at its input D at its output Q.

The data input D of the register 131, 132, 133, 134, respectively is connected to an output of the multiplexer 140, 141, 142, 143 respectively. Each multiplexer 140, 141, 142, 143 has three n-bit parallel inputs respectively connected to the n most significant bits SH of the output of the memory 110, the least significant bits SL of the output of the memory 110 and the n-bit output of the register 120. At its output, each multiplexer gives a data that it receives at either of its inputs as a function of a selection signal SEL_IN0, SEL_IN1, SEL_IN2, SEL_IN3. The multiplexer 150 for its part has five n-bit parallel inputs, each connected to the output of the register 120, 131, 132, 133 or 134, and one n-bit parallel output forming the output QOUT of the FIFO memory. At its output, the multiplexer 150 gives a data that its receives on one of its five inputs as a function of the selection signal R_J and LEVEL_EQUAL_1.

Finally, on the basis of the signals D_SRDY, Q_DRDY, RESET, the logic circuit 160 manages the operation of the FIFO memory, in producing the set of control signals of the RAM 110, the registers 120, 131, 132, 133, 134, the multiplexers 140, 141, 142, 143, 150, and produces the output signals D_DRDY and Q_SRDY, so as to provide for a total functioning of the memory as described in detail here below. The circuit 160 also manages the priorities of the command of the FIFO memory; for example, during a same clock cycle, if a writing condition and a reading condition are received simultaneously, then first the writing and then the reading is done. Finally, the circuit 160 updates the level LEVEL of the FIFO memory, namely the number of data words contained in the memory 100. The term RG_D denotes the active signal indicating that the word is stored in the memory 100 and the term RG_Q denotes the active signal indicating that the word is output from the memory (word read at the output Q). After each read/write operation, LEVEL is updated according to the following relationships:

LEVEL=0 if RESET is active

Else LEVEL=LEVEL+RG_D−RG_Q

The logic circuit 160, the memory 110 and the registers 120, 131, 132, 133, 134 are synchronized and paced by a clock signal CLK (the clock signal is not shown for the sake of clarity).

The following is a detailed description of the operation of the FIFO memory according to an embodiment of the invention.

1. Writing of Several Words in the FIFO Memory

It is assumed here that the memory 100 is reset by an active RESET signal; the memory 100 is therefore empty (memory 110 and registers 120, 131, 132, 133, 134 empty) and the level LEVEL is equal to 0.

When the signals D_DRDY and D_SRDY are active, a first word is present at the input DIN of the memory 100. It is stored on a leading edge of CLK; more specifically, it is immediately copied to a register 152 by means of the register 120; therefore, the first word is present at the output QOUT of the FIFO memory (free). The level LEVEL passes to 1. Although not shown, the register 152 may have an enable input coupled to appropriate circuitry such as the logic circuit 60.

When the signals D_DRDY and D_SRDY are again active, a second word present at the input DIN is stored in the FIFO on a leading edge of CLK; more specifically, since the output QOUT of the FIFO memory is not free (as the first word has not yet been read), the second word is stored in the register of 131 by means of the register 120 and the multiplexer 141. The level LEVEL passes to 2.

When the signals D_DRDY and D_SRDY are again active, a third word present at the input DIN is stored in the FIFO on a leading edge of CLK; more specifically, the output QOUT of the FIFO memory is not free (as the first word has not yet been read) and since the register 131 is occupied (the second word is again stored in the register 131), the third word is stored in the register 132 by means of the register 120 and the multiplexer 142, and the level LEVEL passes to 3. The fourth word and the fifth word are stored similarly in the registers 133, 134 by means of the multiplexers 143, 144. The level LEVEL passes to 4 and then to 5. During the storage of the fifth word in the register 134, a sixth word present at the input DIN is placed at output of the register 120, on the same clock edge.

Since the signals D_DRDY and D_SRDY are again active and since LEVEL is equal to 5, during the next active clock edge, the sixth data word, present at output of the register 120, and the seventh data word, present at the input of the register 120, are stored simultaneously in the memory 110. LEVEL is incremented to 7. The following words present at the input DIN are then stored two by two in the memory 110, at every two active edges of the clock signal, and the level LEVEL is implemented accordingly. That is, on the first of the two active edges of the clock signal, a first word present at DIN is placed at the output of the register 120; on the second of the two active edges, the first word and a second word present at DIN are simultaneously loaded into the memory 110 via the inputs EL and EH, respectively. Then the level LEVEL is incremented accordingly.

2. Reading of Several Words in the FIFO Memory

It is assumed here that, initially, a large number of words has been stored in the FIFO memory as described here above; in particular, the first word is present at the output QOUT of the FIFO memory, the next four words are stored in the registers 131 to 134 and the next words are stored, by word pairs, in the RAM 110. The signal Q_SRDY is active since the memory is not vacant.

When the signal Q_DRDY is active, the first word is read at the output QOUT of the FIFO memory and the level LEVEL is decremented by 1. During the next leading edge of the clock signal, the second word, stored in the register 131, is positioned at the output QOUT of the FIFO memory. The second word is read at the output QOUT of the memory, LEVEL is decremented by 1 and the third word, present in the register 132, is placed at the output QOUT of the FIFO memory.

With the two registers 131, 132 having become free, a word pair (the first pair written into the memory 110) present in the memory 110 is stored in the registers 131, 132 by means of the multiplexers (WEN inactive, RAM controlled in read mode).

The words stored in the registers 133, 134 are then successively positioned at the output QOUT in the course of the read instructions (Q_DRDY active). As soon as the registers 133, 134 are empty, two words are read in the memory 110 and stored in the registers 133, 134. Whenever a word is read at the output QOUT of the FIFO memory, LEVEL is decremented accordingly.

3. Write/Read Operations in the FIFO Memory, Synthesis

A word to be written into the FIFO memory 100 is written as follows:
  at the output QOUT of the FIFO memory if it is free, or
  in the first free register among the registers 131, 132, 133, 134 if the output QOUT is not free and if at least one of the registers 131, 132, 133, 134 is free, or
  else in the memory 110, the word being always stored by pairs in the memory 110.

The first word to be read is positioned immediately at the output QOUT of the memory. The other words to be read are positioned successively at the output QOUT of the memory and come from any one of the registers 131, 132, 133 or 134. As soon as two of the registers 131, 132, 133, 134 are free, and if the memory 110 is not empty, then two words of the memory 110 are pre-positioned in the empty registers 131, 132, 133 or 134, pending their being positioned at the output QOUT of the FIFO memory. The level LEVEL is incremented/decremented as and when write/read operations are performed in the FIFO.

It will be noted that, to make a FIFO like that of FIG. 1 and with a frequency f (input speed of the words at the input DIN or output speed of the words at the output QOUT), it is enough to use a basic memory 110 at a frequency equal to f/2, since the words are written/read in the memory 110 two by two. Since the frequency is lower, the memory is easier to make. Furthermore, experience shows that the silicon surface area needed for a FIFO memory with a size M*n according to FIG. 1 is smaller by about 40% (especially through a reduction in the size of the memory cells and the use of only one communications port) than a memory needed for a prior art FIFO memory of the same size M*n using a dual-port RAM.

Furthermore, in the example of FIG. 1, the storage circuit 130 has four registers 131 to 134. Through this approach, a word is immediately read in the FIFO as soon as a read signal is received because, inasmuch as the FIFO memory is not empty, there is always a word either in one of the registers 131 to 134 or in the register 120, ready to be read. It will be noted that, in this case, a command for reading the FIFO (in practice a register 120, 131 to 134) may be executed simultaneously with a command for writing to the FIFO (in practice, writing to one of the registers or writing to the basic memory 110.

It is possible to use a circuit 130 comprising fewer registers, for example only two or three of them. Thus, a slightly smaller FIFO memory (with one or two registers less) could be obtained. However, in certain special circumstances, the command for reading in the FIFO may not be immediately executed because the storage circuit 130 is empty while the FIFO itself is not empty. This could be the case if several successive commands for writing to the basic memory are activated, preventing the execution of a read command in the basic memory to load the storage circuit 130. (It may be recalled that the memory 110 is a single-port memory, i.e., that it is not possible to perform a write operation and a read operation simultaneously on the memory 110).

A circuit 130 comprising more than four registers could also be used. This has little utility inasmuch as it would not improve the performance of the FIFO since, with the four registers, there is already no waiting in the read mode.

II. SECOND EMBODIMENT OF THE INVENTION

Figure 2:
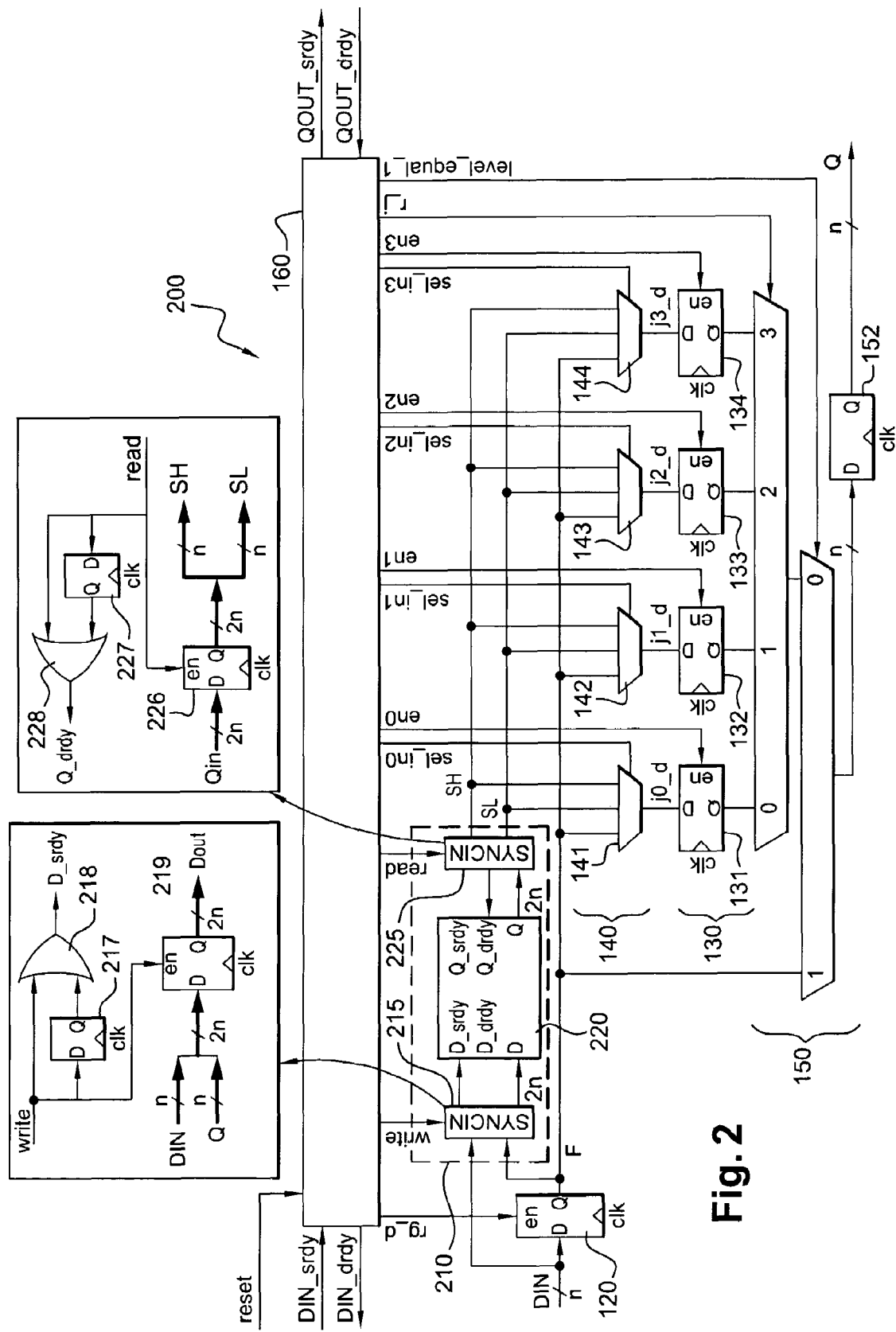

A second example of a FIFO memory according to the invention is shown in FIG. 2. From an overall external point of view, it is identical to the memory of FIG. 1: it has an input DIN and output QOUT of n-bit data, it receives two control signals D_SRDY and Q_DRDY, and its overall operation is the same. The memory 200 also has a capacity of M n-bit words and a frequency f.

The FIFO memory 200 can be distinguished from the memory 100 of FIG. 1 by the fact that the RAM type basic memory 110 has been replaced by a basic memory 210 comprising an input circuit 215, a memory 220 and an output circuit 225.

The memory 220 is a FIFO memory according to the second embodiment of the invention, similar to the memory 100 of FIG. 1, and having the following characteristics: the memory 220 processes 2*n-bit words and can store up to (M−1)/2−12*n-bit words. The memory 220 has a frequency equal to f/2, f being the frequency of the memory 200. The FIFO memory 220 has a RAM with (M−1)/4−2 words of 4*n bits and a frequency equal to f/4. The memory 220 also has a register 120, a storage circuit 130 comprising four 2*n-bit registers 131, 132, 133, 134, and a selection circuit 140 and a multiplexer 150 all appropriately sized so as to manage 2*n-bit words.

The input circuit 215 is connected between, firstly, the input and output of the register 120 and, secondly, the data input of the memory 220. The circuit 215, when a signal WRITE for writing to the memory 220 is received, associates the n bits words received at the input DIN of the FIFO memory so as to give 2*n-bit words at the input of the memory 220.

The circuit 215 has a 2*n bits register 219, a one-bit register 217 and a logic gate 218. The register 219 has two n-bits parallel inputs, connected respectively to the input DIN of the memory 200, and to the output Q of the register 120. The write signal WRITE is applied to an enabling input of the register 219, a data input of the register 217 and an input of the gate 218. The gate 218 is of the OR type and also has a second input connected to the output of the register 217 and an output producing the control signal DOUT_SRDY-applied to the memory 220.

The output circuit 225 is connected between, firstly, the output of the memory 220 and, secondly, the inputs of the multiplexers 141, 142, 143, 144. The circuit 225, when a signal READ for reading the memory 220 is received, dissociates the 2*n-bit words output from the memory 220 to produce n-bit words.

The circuit 225 has a register 226 with a 2*n-bit data input QIN connected to the output Q of the memory 220 and two parallel data outputs SH, SL each outputting n bits and each connected to one input of the input of each multiplexer 141, 142, 143, 144. The register 226 also has an enabling input to which the signal READ is applied. In the example, the gate 228 is of the AND type, and comprises an output at which there is produced an enabling signal Q_DRDY applied to one of the enabling inputs of the memory 220. The gate 228 also has an input to which the signal READ is applied and an input connected to the data output of the register 227 whose clock frequency is set by the clock signal CLK. The AND gate produces the signal Q_DRDY which is applied to an enabling input of the memory 220. One clock cycle after the activation of the signal READ, the gate 228 produces a signal Q_DRDY (delay at the activation of the register 227) which activates the output of a data of the memory 220, the output data being applied to the input of the register 226. Since the signal READ is active, said data is immediately presented to the output of the register 226.

It will be noted that, to make a FIFO such as the one of FIG. 2 and with a frequency f (input speed of the words at the input D or output speeds of the words at the output Q), it is enough to use a RAM (used to make the FIFO 220 according to the embodiment of FIG. 1) with a frequency equal to f/4, since the words are written/read in the memory 220 two by two, and therefore in the RAM four by four.

III. OTHER EMBODIMENTS OF A FIFO ACCORDING TO THE INVENTION

The FIFO 200 of FIG. 2 can be distinguished from the FIFO 100 of FIG. 1, which has the same size M*n and the same frequency f as itself, by the fact that the RAM 110 (with a size $[(M-1)/2-1]*2n$ and a frequency f/2) has been replaced by a FIFO 220 with a size $[(M-1)/2-1]*2n=[(M-1)/2^1-1]*2^1 \cdot n$, and a frequency f/2 itself using a RAM with a size $[(M-1)/2^2-2]*2^2 \cdot n$ and a frequency f/4. The FIFO 220 of FIG. 2 can be made according to FIG. 1; it can also be made according to FIG. 2, i.e., it can itself be made from a FIFO according to the second embodiment of the invention.

Thus, another FIFO according to an embodiment of the invention with a size M*n and a frequency f can be made by using:

a FIFO according to an embodiment of the invention with a size $[(M-1)/2^1-1]*2^1 \cdot n$, and a frequency f/2, this FIFO comprising:

a FIFO according to an embodiment of the invention with a size $[(M-1)/2^2-2]*2^2 \cdot n$ and a frequency f/4, this FIFO comprising:

a RAM with a size $[(M-1)/2^3-2]*2^3 \cdot n$ and a frequency $f/2^3$.

This idea provides the possibility of using very-low-speed or very-low-frequency RAMs to make very fast FIFOs. This, of course, has a very positive effect on the overall size of the FIFO and on its energy consumption.

Thus, to make a FIFO with a frequency f, capable of storing M words (length of the FIFO) of n bits (width of the FIFO), it is possible to use:

a RAM with a frequency f/2, capable of storing (M−1)/2−1 words of 2*n bits, according to FIG. 1, or a RAM with a frequency f/4, capable of storing (M−1)/4−2 words of 4*n bits, according to FIG. 2, or a RAM with a frequency f/8, capable of storing (M−1)/$2^3$−3 words of 8*n bits: to this end, it is enough to make a FIFO similar to that of FIG. 2, in simply replacing the memory 220 of FIG. 2 by a memory similar to that of FIG. 2 but with a size of (M−1)/2−1 words of 2*n bits or more generally a RAM with a frequency $f/2^{(p-1)}$ capable of storing $(M-1)/2^{(p-1)}-(p-1)$ words of $2^{(p-1)}*n$ bits.

Finally, for a set of given parameters (word width, the number of words, total throughput rate of words from the overall FIFO memory and speed of RAM used), a FIFO is made using a number of stages (=number of interconnected FIFOs according to an embodiment of the invention) chosen to achieve an efficient compromise between the total size of the FIFO, its energy consumption and the desired frequency f.

The memories 100 and 200 of FIGS. 1 and 2 can be used in electronic systems such as computer systems.

From the foregoing it will be appreciated that, although specific embodiments of the invention have been described herein for purposes of illustration, various modifications may be made without deviating from the spirit and scope of the invention.

What is claimed is:

1. A memory circuit, comprising:
    a first level memory core operable to store data;
    a first level load circuit coupled to the memory core and operable, without using an address pointer, to,
        receive the data in an order and at a first rate, and
        load the data into the memory core in the order and at a second rate that is less than the first rate; and
    a first level unload circuit operable, without using an address pointer, to,
        unload the data from the memory in the order and at a third rate, and
        provide the unloaded data in the order and at a fourth rate that is greater than the third rate;
    wherein the first level memory core comprises:
        a second level memory core operable to store the data;
        a second level load circuit coupled to the second level memory core and operable to,
        receive the data from the first level load circuit in the order and at the second rate, and
        load the data into the second level memory core in the order and at a fifth rate that is less than the second rate; and
        a second level unload circuit operable to,
        unload the data from the second level memory core in the order and at a sixth rate that is less than the third rate, and
        provide the unloaded data to the first level unload circuit in the order and at the third rate.

2. The memory circuit of claim 1 wherein:
    the memory core comprises a 2n bit data input port coupled to the load circuit and a 2n bit data output port coupled to the unload circuit;
    the load circuit comprises an n bit data input port operable to receive the data and a 2n bit data output port coupled the input port of the memory core; and
    the unload circuit comprises a 2n bit data input port coupled to the output port of the memory core and an n bit data output port operable to provide the data unloaded from the memory core.

3. The memory circuit of claim 1 wherein:
    the first rate is substantially twice the second rate;
    the third rate substantially equals the second rate; and
    the fourth rate substantially equals the first rate.

4. The memory circuit of claim 1 wherein:
    the first rate is substantially twice the second rate;
    the third rate substantially equals the second rate;
    the fourth rate substantially equals the first rate;
    the fifth rate is substantially half the second rate; and
    the sixth rate is substantially half the third rate.

5. The memory circuit of claim 1 wherein:
    the first level load circuit comprises an n bit data input port operable to receive the data and a 2n bit data output port;

the first level unload circuit comprises a 2n bit data input port and an n bit data output port operable to provide the data unloaded from the first level memory core;

the first level memory core comprises a 2n bit data input port coupled to the output port of the first level load circuit and a 2n bit data output port coupled to input port of the first level unload circuit;

the second level load circuit comprises a 2n bit data input port coupled to the data input port of the first level memory core and a 4n bit data output port;

the second level unload circuit comprises a 4n bit data input port and a 2n bit data output port coupled to the 2n bit data input port of the first level unload circuit; and the second level memory core comprises a 4n bit data input port coupled to the output port of the second level load circuit and a 4n bit data output port coupled to input port of the second level unload circuit.

6. A method, comprising:

receiving data in an order and at a first rate;

loading the received data into a first level memory core at a second rate that is lower than the first rate without using an address pointer;

unloading the data from the first level memory core at a third rate; and providing the unloaded data in the received order at a fourth rate that is greater than the third rate without using an address pointer;

loading the data from the first level memory core into a second level memory core at a fifth rate that is lower than the second rate; and unloading the data from the second level memory core to the first level memory core at a sixth rate that is lower than the third rate.

7. The method of claim 6 wherein the first rate is substantially equal to the fourth rate.

8. The method of claim 6 wherein the second rate is substantially equal to the third rate.

9. The method of claim 6 wherein the first rate is substantially twice the second rate.

* * * * *